(12) United States Patent
Luo et al.

(10) Patent No.: US 11,864,406 B2
(45) Date of Patent: Jan. 2, 2024

(54) FLEXIBLE DISPLAY MODULE AND FOLDABLE DISPLAY APPARATUS

(71) Applicant: BOE Technology Group Co., Ltd., Beijing (CN)

(72) Inventors: Xiaofei Luo, Beijing (CN); Shangchieh Chu, Beijing (CN); Baofeng Sun, Beijing (CN); Yanyan Yang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 359 days.

(21) Appl. No.: 17/359,681

(22) Filed: Jun. 28, 2021

(65) Prior Publication Data

US 2022/0173353 A1    Jun. 2, 2022

(30) Foreign Application Priority Data

Dec. 1, 2020  (CN) .......................... 202022854438.X

(51) Int. Cl.
*H10K 50/84*  (2023.01)
*H10K 102/00*  (2023.01)

(52) U.S. Cl.
CPC ....... *H10K 50/84* (2023.02); *H10K 2102/311* (2023.02)

(58) Field of Classification Search
CPC ....................................................... H05K 5/00
See application file for complete search history.

(56) References Cited

U.S. PATENT DOCUMENTS

2017/0068275 A1 * 3/2017 Lee ........................ G06F 1/1643
2017/0192460 A1 * 7/2017 Watanabe .......... G02F 1/133305

* cited by examiner

*Primary Examiner* — Jerry Wu
(74) *Attorney, Agent, or Firm* — Ling Wu; Stephen Yang; Ling and Yang Intellectual Property

(57) ABSTRACT

A flexible display module and a foldable display apparatus are provided. The flexible display module is assembled with a shell of the foldable display apparatus. The flexible display module includes a bending region, a display panel and a back plate provided on a side of the display panel away from a display side. The flexible display module further includes a support member disposed on a first surface of the back plate away from the display panel, wherein the support member is located in a middle region in a width direction of the bending region, and the support member is configured to be fixed with the shell. A first side surface of the support member is attached and fixed to the first surface of the back plate, a second side surface adjacent to the first side surface of the support member extends along a length direction of the bending region.

14 Claims, 3 Drawing Sheets

FLEXIBLE DISPLAY MODULE AND FOLDABLE DISPLAY APPARATUS

CROSS-REFERENCE TO RELATED APPLICATION

The present application claims priority of Chinese Patent Application No. 202022854438.X, filed to the CNIPA on Dec. 1, 2020, the content of which is hereby incorporated by reference.

TECHNICAL FIELD

Embodiments of the present disclosure relate to, but are not limited to, the field of display technology, in particular to a flexible display module and a foldable display apparatus.

BACKGROUND

With the progress of science and technology and the development of society, flexible display screens have gradually entered the consumers' field of vision, among which bendable display screens and rollable display screens bring consumers a new experience while facilitating their lives. A complete flexible screen module (or referred to as a flexible display module) is formed by stacked film materials of weak strength. When applied to a foldable display apparatus, a flexible screen module often needs to be switched between an unfolded state and a folded state. Due to limited recovery capability of the film materials of the flexible screen module, problems such as a bulge in a bending region (which is in a bent shape when the foldable display apparatus is in the folded state) will appear when in an unfolded state.

In some foldable display apparatuses, a support column fixed to the bending region of the flexible screen module is provided under the screen to prevent the bulge of the bending region when the flexible screen module is unfolded. However, connection between the flexible screen module and the support column is prone to crack, which may affect the use of the flexible screen module.

SUMMARY

The following is a summary of subject matters described in detail in the present disclosure. This summary is not intended to limit the protection scope of the claims.

An embodiment of the present disclosure provides a flexible display module configured to be assembled with a shell of a foldable display apparatus. The flexible display module includes a bending region which is configured to be in a bent shape when the flexible display module is in a folded state. The flexible display module includes a display panel and a back plate disposed on one side of the display panel away from a display side, wherein the back plate has a first surface facing away from the display side of the display panel. The flexible display module further includes a support member disposed on the first surface of the back plate, wherein the support member is located in a middle region in a width direction of the bending region, and the support member is configured to be fixed with the shell of the foldable display apparatus. The support member has a first side surface and a second side surface which are adjacent to each other, the first side surface of the support member is attached and fixed to the first surface of the back plate, the second side surface of the support member extends along a length direction of the bending region, and a flexible part is connected between the second side surface of the support member and the first surface of the back plate.

In an exemplary embodiment, intersection between a second side surface of the support member and the first surface of the back plate is filled and consolidated with a flexible fixing adhesive, and the flexible fixing adhesive is the flexible part.

In an exemplary embodiment, a surface of the flexible fixing adhesive is an arc-shaped surface recessed inward, or the surface of the flexible fixing adhesive is an inclined surface.

In an exemplary embodiment, a flexible layer is provided on the second side surface of the support member, a side of the flexible layer facing the back plate is bonded to a first surface of the back plate, and the flexible layer is the flexible part.

In an exemplary embodiment, a surface of the flexible layer facing away from the second side surface of the support member is provided with a groove extending along the length direction of the bending region.

In an exemplary embodiment, the groove is a V-shaped groove.

In an exemplary embodiment, a part of the back plate corresponding to the bending region includes a first opening region, a first solid region and a second opening region which are disposed in sequence along the width direction of the bending region, wherein the first opening region and the second opening region are provided with multiple openings, and the first side surface of the support member is attached and fixed to the first solid region.

In an exemplary embodiment, the support member has two second side surfaces which are opposite to each other, a first flexible part is connected between one of the second side surfaces of the support member and a part of the first surface of the back plate corresponding to the first opening region, and a second flexible part is connected between the other second side surface of the support member and a part of the first surface of the back plate corresponding to the second opening region; the flexible part includes the first flexible part and the second flexible part.

In an exemplary embodiment, the back plate further includes a second solid region located on one side of the first opening region away from the first solid region, and a third solid region located on one side of the second opening region away from the first solid region, wherein the second solid region and the third solid region are respectively located on two sides of the bending region.

In an exemplary embodiment, a material of the back plate includes any one or more of stainless steel, copper and aluminum; or/and a material of the support member includes any one or more of stainless steel, copper and aluminum.

An embodiment of the present disclosure further provides a foldable display apparatus, including a shell and a flexible display module assembled on the shell.

Herein, the flexible display module includes a bending region, and the bending region is configured to be in a bent shape when the flexible display module is in a folded state.

The flexible display module further includes a display panel and a back plate disposed on one side of the display panel away from a display side, wherein the back plate has a first surface away from the display side of the display panel.

The flexible display module further includes a support member disposed on the first surface of the back plate, wherein the support member is located in a middle region in a width direction of the bending region, and the support member is configured to be fixed with the shell of the foldable display apparatus. The support member has a first side surface and a second side surface which are adjacent to each other, the first side surface is attached and fixed to the first surface of the back plate, the second side surface extends along a length direction of the bending region, and a flexible part is connected between the second side surface and the first surface of the back plate.

The shell includes a first shell, a second shell and a connecting shaft, wherein the first shell and the second shell are both hinged on the connecting shaft. Parts of the flexible display module located on two sides of the bending region are respectively disposed on the first shell and the second shell; the bending region corresponds to the connecting shaft; the support member further has a third side surface opposite to the first side surface, and the third side surface of the support member is fixed on the connecting shaft.

In an exemplary embodiment, intersection between the second side surface of the support member and the first surface of the back plate is filled and consolidated with a flexible fixing adhesive, and the flexible fixing adhesive is the flexible part.

In an exemplary embodiment, a surface of the flexible fixing adhesive is an arc-shaped surface recessed inward, or the surface of the flexible fixing adhesive is an inclined surface.

In an exemplary embodiment, a flexible layer is provided on the second side surface of the support member, a side of the flexible layer facing the back plate is bonded to the first surface of the back plate, and the flexible layer is the flexible part.

In an exemplary embodiment, a surface of the flexible layer facing away from the second side surface of the support member is provided with a groove extending along the length direction of the bending region.

In an exemplary embodiment, the groove is a V-shaped groove.

In an exemplary embodiment, a part of the back plate corresponding to the bending region includes a first opening region, a first solid region and a second opening region which are disposed in sequence along the width direction of the bending region, wherein the first opening region and the second opening region are each provided with multiple openings, and the first side surface of the support member is attached and fixed to the first solid region.

In an exemplary embodiment, the support member has two second side surfaces which are opposite to each other, a first flexible part is connected between one of the second side surfaces of the support member and a part of the first surface of the back plate corresponding to the first opening region, and a second flexible part is connected between the other second side surface of the support member and a part of the first surface of the back plate corresponding to the second opening region; the flexible part includes a first flexible part and a second flexible part.

In an exemplary embodiment, the back plate further includes a second solid region located on one side of the first opening region away from the first solid region, and a third solid region located on one side of the second opening region away from the first solid region, wherein the second solid region and the third solid region are respectively located on two sides of the bending region.

In an exemplary embodiment, a material of the back plate includes any one or more of stainless steel, copper and aluminum; or/and a material of the support member includes any one or more of stainless steel, copper and aluminum.

Other aspects will become apparent upon reading and understanding accompanying drawings and the detailed description.

BRIEF DESCRIPTION OF DRAWINGS

Drawings are used to provide a further understanding of technical solutions of the present disclosure and form a part of the description of the present disclosure to explain the technical solutions of the present disclosure together with embodiments of the present disclosure, which do not form any limitation on the technical solutions of the present disclosure.

DETAILED DESCRIPTION

The technical solutions of the present disclosure will be further explained in the following with reference to the drawings and specific embodiments. It can be understood that the embodiments described herein are only for explaining the present disclosure, rather than limiting the present disclosure. The embodiments and features in the embodiments in the present disclosure may be combined randomly if there is no conflict.

Figure 1:
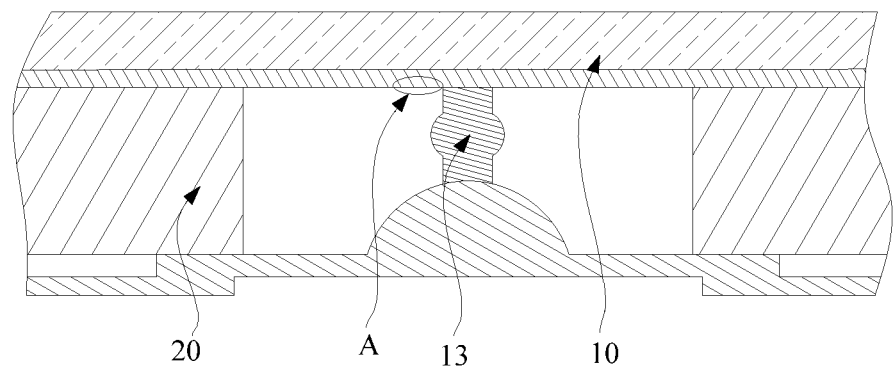
FIG. 1 is a schematic diagram of a partial structure of a foldable display apparatus.

Some foldable display apparatuses include a shell 20 and a flexible display module 10 mounted on the shell 20. The shell 20 is provided with a hinge structure for enabling the foldable display apparatus to be switched between a folded state and an unfolded state. When the foldable display apparatus is in the folded state, a bending region of the flexible display module 10 is folded. Due to limited recovery capability of the film material of the flexible display module 10, a problem of bulge in the bending region of the flexible display module 10 will appear when in the unfolded state. As shown in FIG. 1, the bending region of the flexible display module 10 is fixed on the shell 20 by providing a support member 13 on one side of the flexible display module 10 away from a display side, so that the bending region is prevented from bulging when the flexible display module 10 is in the unfolded state. However, a part (area A in FIG. 1) of the flexible display module 10 connected with the support member 13 during a bending process is prone to stress concentration, which results in local cracks.

Figure 2:
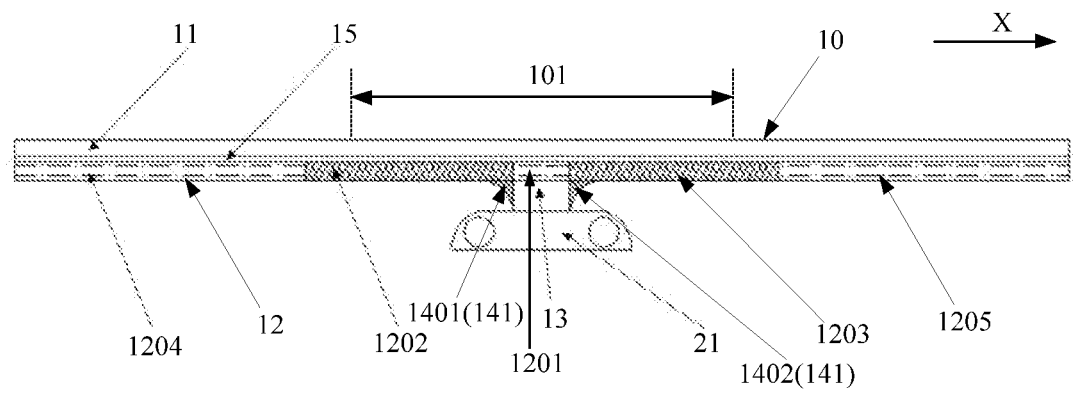
FIG. 2 is a schematic diagram of a structure of a flexible display module according to some exemplary embodiments.

An embodiment of the present disclosure provides a flexible display module configured to be assembled with a shell of a foldable display apparatus. FIG. 2 shows a schematic diagram of a structure of the flexible display module 10 in an unfolded state according to some exemplary embodiments. The flexible display module 10 includes a bending region 101, wherein the bending region 101 is configured to be bent when the flexible display module 10 is in a folded state. The flexible display module 10 further includes a display panel 11 and a back plate 12 disposed on one side of the display panel 11 away from a display side, wherein the back plate 12 has a first surface away from the display side of the display panel 11. The flexible display module 10 further includes a support member 13 disposed on the first surface of the back plate 12, wherein the support member 13 is located in a middle region in a width direction of the bending region 101. The width direction of the bending region 101 is the X direction shown in FIG. 2, and the support member 13 is configured to be fixed with the shell of the foldable display apparatus. The support member 13 has a first side surface and a second side surface which are adjacent to each other, wherein the first side surface 131 (shown in FIG. 4*a*) of the support member 13 is attached and fixed to a first surface of the back plate 12, and the second side surface 132 (shown in FIG. 3) of the support member 13 extends along a length direction of the bending region 101 (a direction perpendicular to the X direction on a plane parallel to the display panel, as shown in the example of FIG. 2). A flexible part is connected between the second side surface 132 of the support member 13 and the first surface of the back plate 12 (in the example shown in FIG. 2, the flexible part includes a first flexible part 1401 and a second flexible part 1402).

The flexible display module 10 of the embodiment of the present disclosure is assembled with a shell of a foldable display apparatus when applied to the foldable display apparatus. A support member 13 is provided on the first surface of the back plate 12 facing away from the display side of the display panel 11, and the support member 13 is located in the middle region of the bending region 101 in the width direction of the flexible display module 10. The support member 13 is configured to be fixed to the shell of the foldable display apparatus. In this way, the middle region of the bending region 101 of the flexible display module 10 can be fixed on the shell by the support member 13, so as to prevent the bulging phenomenon in the bending region 101 from taking place when the flexible display module 10 is in the unfolded state. In addition, the flexible part is connected between the second side surface 132 of the support member 13 and the first surface of the back plate 12, so that the flexible part can serve to protect the back plate 12 during the bending process of the flexible display module 10, which can avoid stress concentration during the bending process at the part of the back plate 12 connected with the support member 13, thereby avoiding cracks caused by local stress concentration.

As shown in FIG. 2, in some exemplary embodiments, an intersection between the second side surface 132 of the support member 13 and the first surface of the back plate 12 is filled and consolidated with a flexible fixing adhesive 141, wherein the flexible fixing adhesive 141 is the flexible part. In an embodiment of the present disclosure, the adhesive which is the flexible fixing adhesive 141 after being consolidated may be coated at the intersection between the second side surface 132 of the support member 13 and the first surface of the back plate 12 along an extending direction of the second side surface 132 of the support member 13. In this way, after dried and solidified, the adhesive is attached between the second side surface 132 of the support member 13 and the first surface of the back plate 12. In an example of the present embodiment, a surface of the flexible fixing adhesive 141 is an arc-shaped surface recessed inward, which can naturally form an arc-shaped surface after the adhesive is dried and consolidated, as shown in FIG. 2. In other examples, the surface of the flexible fixing adhesive 141 may be an inclined surface.

Figure 3:
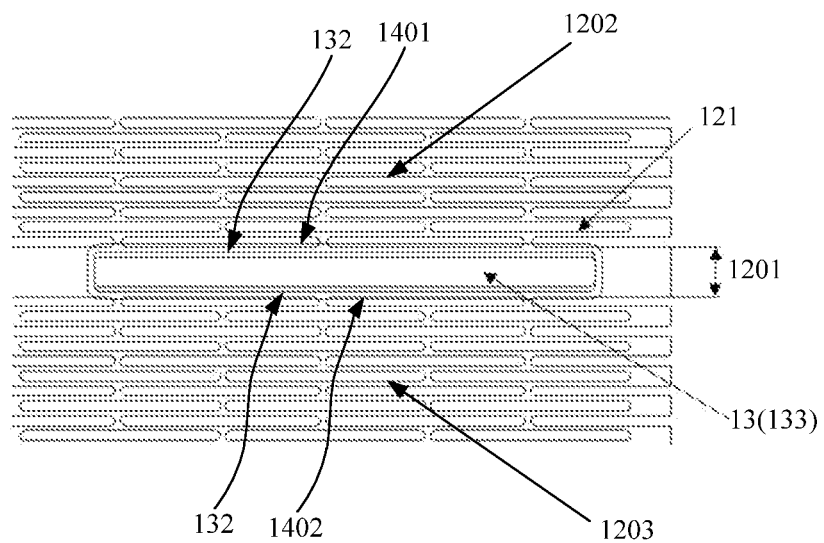
FIG. 3 is a schematic diagram of a plane structure of a bending region of a flexible display module according to some exemplary embodiments.

As shown in FIGS. 2 and 3, in some exemplary embodiments, a part of the back plate 12 corresponding to the bending region 101 includes a first opening region 1202, a first solid region 1201 and a second opening region 1203 which are disposed in sequence along the width direction of the bending region 101. The first opening region 1202 and the second opening region 1203 are each provided with multiple openings 121, and the first side surface 131 of the support member 13 is attached and fixed to the first solid region 1201. In an example of this embodiment, the multiple openings 121 of the first opening region 1202 may be uniformly distributed in the entire first opening region 1202, and the multiple openings 121 of the second opening region 1203 may be uniformly distributed in the entire second opening region 1203, so as to improve the deformability of the bending region 101. The shape of the openings 121 may be round, oval, rectangular, etc. The first side surface 131 (shown in FIG. 4*a*) of the support member 13 and a part of the first surface of the back plate 12 corresponding to the first solid region 1201 may be welded and fixed to each other by spot welding. The support member 13 may have a length smaller than the bending region 101, that is, two ends in a length direction of the support member 13 have a certain distance from corresponding side edges of the back plate 12, and the distances between the two ends in the length direction of the support member 13 and the corresponding side edges of the back plate 12 may be equal. The support member 13 and the first solid region 1201 may have a same width.

As shown in FIG. 2 and FIG. 3, in some exemplary embodiments, the support member 13 has two second side surfaces 132 which are opposite to each other. A first flexible part 1401 is connected between one of the second side surfaces of the support member 13 and a part of the first surface of the back plate 12 corresponding to the first opening region 1202, and a second flexible part 1402 is connected between the other second side surface of the support member 13 and a part of the first surface of the back plate 12 corresponding to the second opening region 1203. The flexible part includes the first flexible part 1401 and the second flexible part 1402. The first flexible part 1401 and the second flexible part 1402 may be disposed in a same manner.

As shown in FIG. 2, in some exemplary embodiments, the back plate 12 further includes a second solid region 1204 located on one side of the first opening region 1202 away from the first solid region 1201, and a third solid region 1205 located on one side of the second opening region 1203 away from the first solid region 1201, wherein the second solid region 1204 and the third solid region 1205 are respectively located on two sides of the bending region 101. In this embodiment, along the width direction of the bending region 101, the back plate 12 is divided into five sections, including the second solid region 1204, the first opening region 1202, the first solid region 1201, the second opening region 1203 and the third solid region 1205 which are sequentially disposed. The first solid region 1201, the second solid region 1204 and the third solid region 1205 are not provided with openings 121, which can provide a flat supporting surface for the display panel 11.

Figures 4A, 4B:
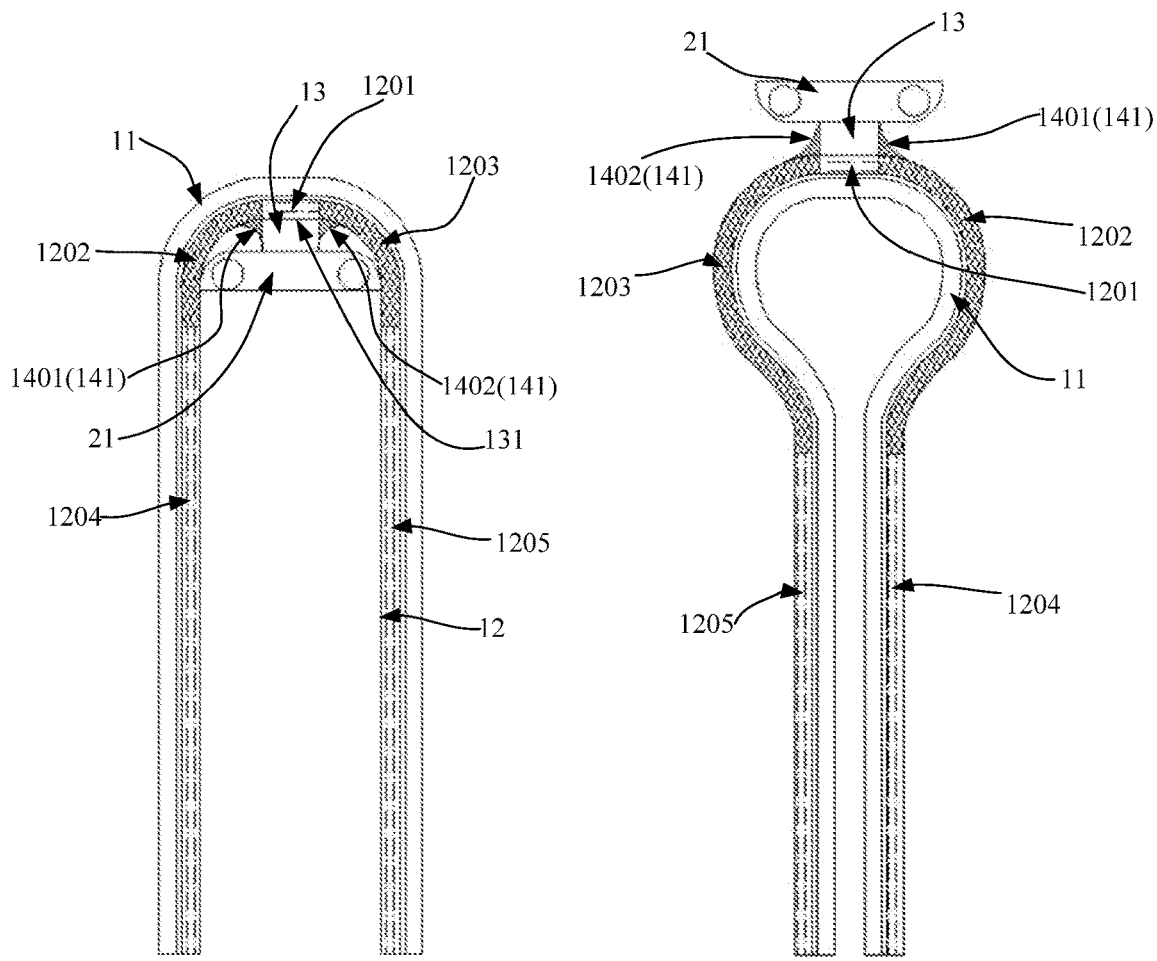
FIG. 4*a* is a schematic diagram of a structure of the flexible display module of FIG. 2 in an outward folded state.
FIG. 4*b* is a schematic diagram of a structure of the flexible display module of FIG. 2 in an inward folded state.

FIG. 4*a* and FIG. 4*b* respectively show diagrams of structures of the flexible display module 10 of the exemplary embodiment of FIG. 2 in an outward folded state and an inward folded state. As shown in FIG. 4*a*, when in the outward folded state, the side where the back plate 12 of the flexible display module 10 is located is compressed, and the first flexible part 1401 and the second flexible part 1402 are compressed, wherein the first flexible part 1401 and the second flexible part 1402 can serve to protect the inner side of the flexible display module 10 and avoid stress concentration on the part where the back plate 12 is connected to the support member 13, thus preventing cracks at the part where the back plate 12 is connected to the support member 13. As shown in FIG. 4b, when in the inward folded state in shape of a water drop, the side where the back plate 12 of the flexible display module 10 is located is stretched, then the first flexible part 1401 and the second flexible part 1402 are also stretched, wherein the first flexible part 1401 and the second flexible part 1402 can serve to protect the outer side of the flexible display module 10 and avoid stress concentration at the part where the back plate 12 is connected to the support member 13, thus preventing cracks at the part where the back plate 12 is connected to the support member 13. In summary, by providing the flexible part at the connection and transition position between the back plate 12 and the support member 13 to connect the back plate 12 and the support member 13, cracks caused by stress concentration at the connection position between the back plate 12 and the support member 13 are avoided, and thus the display module is prevented from being damaged.

Figure 5:
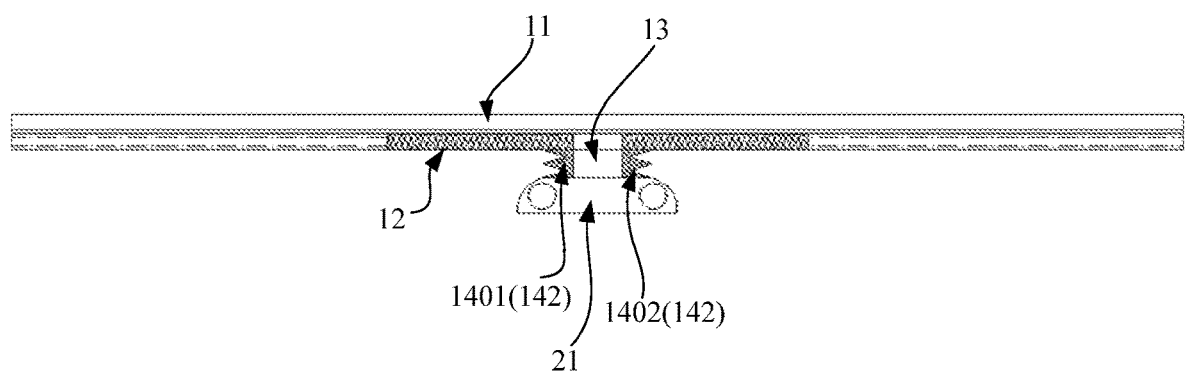
FIG. 5 is a schematic diagram of a structure of a flexible display module according to some other exemplary embodiments.
Figure 6:
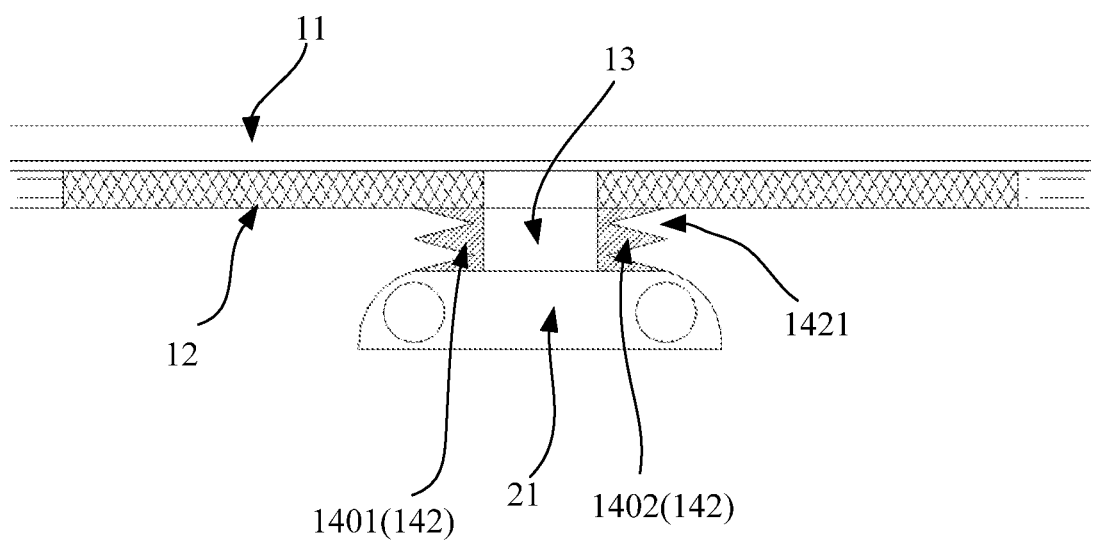
FIG. 6 is a schematic diagram of a partially enlarged structure at a support member of FIG. 5.

As shown in FIGS. 5 and 6, FIG. 6 is a diagram of a partially enlarged structure at the support member 13 of FIG. 5. In some exemplary embodiments, a flexible layer 142 is provided on a second side surface 132 of the support member 13, a side of the flexible layer 142 facing the back plate 12 is bonded to the first surface of the back plate 12, and the flexible layer 142 is the flexible part. In an example of the present embodiment, a material of the flexible layer 142 may be rubber, polyimide, and so on. The flexible layer 142 may be formed on the second side surface 132 of the support member 13 by injection molding and bonded to the first surface of the back plate 12 by an adhesive. As shown in FIG. 6, in an example of the present embodiment, a surface of the flexible layer 142 facing away from a second side surface 132 of the support member 13 is provided with grooves 1421 extending along the length direction of the bending region 101, wherein the grooves 1421 may be V-shaped grooves. The quantity of the grooves 1421 may be one or multiple. After the V-shaped grooves are provided, the surface of the flexible layer 142 facing away from the second side surface 132 of the supporting piece 13 may correspondingly form a zigzag convex edge, as shown in FIG. 6. The V-shaped grooves are formed on the surface of the flexible layer 142 facing away from the second side surface 132 of the support member 13. In this way, the flexible display module can be more compactly attached to the shell on two sides of the support member 13 when folded outward (in the folded state shown in FIG. 4a), and a part where the flexible display module is connected to the support member 13 can be more firmly supported while avoiding stress concentration. When the flexible display module 10 is folded inward (in the folded state shown in FIG. 4b), the flexible layer 142 will unfold more evenly when being stretched, and no extra force will be generated inside the flexible layer 142 due to stretching, so that the stress on the part where the back plate 12 is connected to the support member 13 will also be more even, which avoids the stress concentration.

In some exemplary embodiments, a material of the back plate 12 includes any one or more of stainless steel, copper and aluminum; or/and a material of the support member 13 includes any one or more of stainless steel, copper and aluminum. In an example of this embodiment, the material of the back plate 12 and the material of the support member 13 are both stainless steel, the first side surface 131 of the support member 13 may be bonded and fixed to the first surface of the back plate 12 by an adhesive layer, and a third side surface 133 (shown in FIG. 3) of the support member 13 may be welded to the shell. The back plate 12 can not only serve to support the whole flexible display module, but also to dissipate heat and reduce creases.

In some exemplary embodiments, the back plate 12 has a thickness of 100 um to 200 um, and the support member 13 has a thickness of 2 mm to 4 mm.

In some exemplary embodiments, the flexible display module 10 is an OLED display module. The flexible display module 10 may further include a functional structure layer (such as a touch structure layer), a polarizer and a cover plate stacked on the display side of the display panel 11, and a flexible support layer disposed between the display panel 11 and the back plate 12. etc. A back film may be attached to a surface of the display panel 11 facing away from the display side, and an adhesive layer (such as an optical clear adhesive, OCA for short; pressure sensitive adhesive, PSA for short) 15 may be used for pasting between the film layers.

An embodiment of the present disclosure further provides a foldable display apparatus, which includes a shell and the flexible display module 10 described in any of the above embodiments. The shell includes a first shell, a second shell and a connecting shaft 21 (shown in FIG. 2), wherein the first shell and the second shell are hinged on the connecting shaft 21. Parts of the flexible display module 10 located on two sides of the bending region 101 are respectively disposed on the first shell and the second shell. The bending region 101 corresponds to the connecting shaft 21. The support member 13 further has a third side surface opposite to the first side surface, and the third side surface 133 of the support member 13 is fixed on the connecting shaft 21.

According to the foldable display apparatus of the embodiment of the present disclosure, the middle region of the bending region 101 of the flexible display module 10 can be fixed on a connecting shaft 21 of the shell by the support member 13 provided on the flexible display module 10. During a folding or unfolding process of the foldable display apparatus, the middle region of the bending region 101 of the flexible display module 10 is always fixed on the connecting shaft 21 of the shell, thus avoiding the bulge phenomenon in the bending region 101 when the flexible display module 10 is in the unfolded state. In addition, in the flexible display module 10, the flexible part is connected between the second side surface 132 of the support member 13 and the first surface of the back plate 12, so that the flexible part can serve to protect the back plate 12 during the bending process of the flexible display module 10, which, during the bending process, can avoid cracks caused by stress concentration at the part where the back plate 12 is connected to the support member 13.

In the description of embodiments of the present disclosure, unless otherwise explicitly specified or defined, the terms "connect", "fixed connection", "install" and "assemble" are to be understood broadly, for example, a connection may be a fixed connection, or a detachable connection, or an be integral connection. The terms "install", "connect" and "fixed connection" may refer to a direct connection, or an indirect connection through an intermediate medium, or an internal connection between two elements. Those of ordinary skills in the art can understand the specific meanings of the above mentioned terms in the present disclosure according to specific context.

What is claimed is:

1. A flexible display module configured to be assembled with a shell of a foldable display apparatus, the flexible display module comprises a bending region which is configured to be in a bent shape when the flexible display module is in a folded state, the flexible display module further comprises a display panel and a back plate disposed on one side of the display panel away from a display side, and the back plate has a first surface away from the display side of the display panel; wherein the flexible display module further comprises a support member disposed on the first surface of the back plate, the support member is located in a middle region in a width direction of the bending region, and the support member is configured to be fixed with the shell of the foldable display apparatus; and the support member has a first side surface and a second side surface which are adjacent to each other, the first side surface is attached and fixed to the first surface of the back plate, the second side surface extends along a length direction of the bending region, and a flexible part is connected between the second side surface and the first surface of the back plate; and a flexible layer is provided on the second side surface of the support member, a side of the flexible layer facing the back plate is bonded to the first surface of the back plate, and the flexible layer is the flexible part; and a surface of the flexible layer facing away from the second side surface of the support member is provided with a V-shaped groove extending along the length direction of the bending region; and the shell comprises a first shell, a second shell and a connecting shaft, wherein the first shell and the second shell are both hinged on the connecting shaft; the support member further has a third side surface opposite to the first side surface, and the third side surface of the support member is fixed on the connecting shaft.

2. The flexible display module according to claim 1, wherein intersection between the second side surface of the support member and the first surface of the back plate is filled and consolidated with a flexible fixing adhesive, and the flexible fixing adhesive is the flexible part.

3. The flexible display module according to claim 2, wherein a surface of the flexible fixing adhesive is an arc-shaped surface recessed inward, or the surface of the flexible fixing adhesive is an inclined surface.

4. The flexible display module according to claim 1, wherein a part of the back plate corresponding to the bending region comprises a first opening region, a first solid region and a second opening region which are disposed in sequence along the width direction of the bending region, wherein the first opening region and the second opening region are each provided with a plurality of openings, and the first side surface of the support member is attached and fixed to the first solid region.

5. The flexible display module according to claim 4, wherein the support member has two second side surfaces which are opposite to each other, a first flexible part is connected between one of the second side surfaces of the support member and a part of the first surface of the back plate corresponding to the first opening region, and a second flexible part is connected between the other second side surface of the support member and a part of the first surface of the back plate corresponding to the second opening region; and the flexible part comprises the first flexible part and the second flexible part.

6. The flexible display module according to claim 4, wherein the back plate further comprises a second solid region located on one side of the first opening region away from the first solid region, and a third solid region located on one side of the second opening region away from the first solid region, wherein the second solid region and the third solid region are respectively located on two sides of the bending region.

7. The flexible display module according to claim 1, wherein a material of the back plate comprises any one or more of stainless steel, copper and aluminum; or/and a material of the support member comprises any one or more of stainless steel, copper and aluminum.

8. A foldable display apparatus, comprising a shell and a flexible display module assembled on the shell; the flexible display module comprises a bending region, and the bending region is configured to be in a bent shape when the flexible display module is in a folded state; the flexible display module further comprises a display panel and a back plate disposed on one side of the display panel away from a display side, wherein the back plate has a first surface away from the display side of the display panel; the flexible display module further comprises a support member disposed on the first surface of the back plate, wherein the support member is located in a middle region in a width direction of the bending region, and the support member is configured to be fixed with the shell of the foldable display apparatus; the support member has a first side surface and a second side surface which are adjacent to each other, the first side surface is attached and fixed to the first surface of the back plate, the second side surface extends along a length direction of the bending region, and a flexible part is connected between the second side surface and the first surface of the back plate; and a flexible layer is provided on the second side surface of the support member, a side of the flexible layer facing the back plate is bonded to the first surface of the back plate, and the flexible layer is the flexible part; and a surface of the flexible layer facing away from the second side surface of the support member is provided with a V-shaped groove extending along the length direction of the bending region; and the shell comprises a first shell, a second shell and a connecting shaft, wherein the first shell and the second shell are both hinged on the connecting shaft; parts of the flexible display module located on two sides of the bending region are respectively disposed on the first shell and the second shell; the bending region corresponds to the connecting shaft; the support member further has a third side surface opposite to the first side surface, and the third side surface of the support member is fixed on the connecting shaft.

9. The foldable display apparatus according to claim 8, wherein intersection between the second side surface of the support member and the first surface of the back plate is filled and consolidated with a flexible fixing adhesive, and the flexible fixing adhesive is the flexible part.

10. The foldable display apparatus according to claim 9, wherein a surface of the flexible fixing adhesive is an arc-shaped surface recessed inward, or the surface of the flexible fixing adhesive is an inclined surface.

11. The foldable display apparatus according to claim 8, wherein a part of the back plate corresponding to the bending region comprises a first opening region, a first solid region and a second opening region which are disposed in sequence along the width direction of the bending region, wherein the first opening region and the second opening region are each provided with a plurality of openings, and the first side surface of the support member is attached and fixed to the first solid region.

12. The foldable display apparatus according to claim 11, wherein the support member has two second side surfaces which are opposite to each other, a first flexible part is connected between one of the second side surfaces of the support member and a part of the first surface of the back plate corresponding to the first opening region, and a second flexible part is connected between the other second side surface of the support member and a part of the first surface of the back plate corresponding to the second opening region; and the flexible part comprises the first flexible part and the second flexible part.

13. The foldable display apparatus according to claim 11, wherein the back plate further comprises a second solid region located on one side of the first opening region away from the first solid region, and a third solid region located on one side of the second opening region away from the first solid region, wherein the second solid region and the third solid region are respectively located on two sides of the bending region.

14. The foldable display apparatus according to claim 8, wherein a material of the back plate comprises any one or more of stainless steel, copper and aluminum; or/and a material of the support member comprises any one or more of stainless steel, copper and aluminum.

\* \* \* \* \*